US009528895B2

(12) United States Patent
Robert et al.

(10) Patent No.: US 9,528,895 B2
(45) Date of Patent: Dec. 27, 2016

(54) MICROELECTROMECHANICAL AND/OR NANOELECTROMECHANICAL DIFFERENTIAL PRESSURE MEASUREMENT SENSOR

(71) Applicant: Commissariat à l'énergie atomique et aux énergies alternatives, Paris (FR)

(72) Inventors: Philippe Robert, Grenoble (FR); Bernard Diem, Echirolles (FR); Guillaume Jourdan, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 97 days.

(21) Appl. No.: 14/661,430

(22) Filed: Mar. 18, 2015

(65) Prior Publication Data

US 2015/0268115 A1   Sep. 24, 2015

(30) Foreign Application Priority Data

Mar. 19, 2014   (FR) .................................... 14 52288

(51) Int. Cl.
  *G01L 9/00* (2006.01)
  *G01L 13/02* (2006.01)
  *B81B 3/00* (2006.01)

(52) U.S. Cl.
  CPC .......... *G01L 9/0072* (2013.01); *B81B 3/0021* (2013.01); *G01L 9/001* (2013.01); *G01L 9/006* (2013.01);
  (Continued)

(58) Field of Classification Search
  None
  See application file for complete search history.

(56) References Cited

U.S. PATENT DOCUMENTS 9,157,821 B2 * 10/2015 Robert .................. G01L 9/0052
2003/0072127 A1 * 4/2003 Zias ........................ G01L 1/148
                                                                  361/311
(Continued)

FOREIGN PATENT DOCUMENTS

DE   197 40 244 A1   2/1998
JP   S57-142534 A    9/1982

OTHER PUBLICATIONS

Search Report issued in French Patent Application No. FR 14 52288 dated Jan. 14, 2015.
(Continued)

*Primary Examiner* — Andre Allen
(74) *Attorney, Agent, or Firm* — Pearne & Gordon LLP

(57) ABSTRACT

MEMS and/or NEMS differential pressure measurement sensor comprising at least one first membrane and at least one second membrane, each suspended from a substrate, the first membrane having a face subjected to a reference pressure and a second face subjected to a first pressure to be detected, the second membrane having a first face subjected to the reference pressure and a second face subjected to a second pressure to be detected, a rigid beam of longitudinal axis articulated with respect to the substrate by a pivot link around an axis, said beam being solidly connected by a first zone to the first membrane and by a second zone to the second membrane such that the pivot link is situated between the first zone and the second zone of the beam, a sensor of measuring the movement of the beam around the axis, said sensor being arranged at least in part on the substrate.

21 Claims, 9 Drawing Sheets

(52) U.S. Cl.
CPC ........... *G01L 9/0019* (2013.01); *G01L 9/0052* (2013.01); *G01L 9/0073* (2013.01); *G01L 13/025* (2013.01); *B81B 2201/0264* (2013.01); *B81B 2203/0127* (2013.01); *B81B 2203/0154* (2013.01); *G01L 9/0086* (2013.01)

(56) References Cited

U.S. PATENT DOCUMENTS

| | | | |
|---|---|---|---|
| 2008/0264172 A1* | 10/2008 | Sakurai | G01L 9/0016 73/726 |
| 2009/0120195 A1 | 5/2009 | Willcox | |
| 2011/0147860 A1 | 6/2011 | Robert | |
| 2012/0210792 A1 | 8/2012 | Robert | |
| 2012/0279299 A1 | 11/2012 | Walther | |
| 2013/0000411 A1 | 1/2013 | Robert | |
| 2014/0060169 A1* | 3/2014 | McNeil | B60C 23/0408 73/146.5 |
| 2014/0076024 A1 | 3/2014 | Duraffourg | |
| 2014/0177881 A1 | 6/2014 | Fanget | |
| 2014/0318906 A1 | 10/2014 | Deimerly | |
| 2014/0331770 A1 | 11/2014 | Jourdan | |
| 2014/0338459 A1* | 11/2014 | Besling | G01L 9/0073 73/718 |
| 2014/0342557 A1 | 11/2014 | Diem | |
| 2015/0028433 A1 | 1/2015 | Baillin | |
| 2016/0002026 A1* | 1/2016 | Chodavarapu | B81C 1/00182 257/254 |

OTHER PUBLICATIONS

P.D. Dimitropoulos et al., "A new SOI monolithic capacitive sensor for absolute and differential pressure measurements" Sensors and Actuators A 123-124, 2005.

S.T. Moe et al., "Capacitive differential pressure sensor for harsh environments" Sensors and Actuators, 83, 2000.

Hidetoshi Takahashi et al., "Differential pressure sensor using a piezoresistive cantilever" Journal of Micromechanics and Microengineering, vol. 22, 2012.

U.S. Appl. No. 14/519,390, "Optomechanical Device for Actuating and/or Detecting Movement of a Mechanical Element, in Particular for Gravimetric Detection", filed Oct. 21, 2014.

* cited by examiner

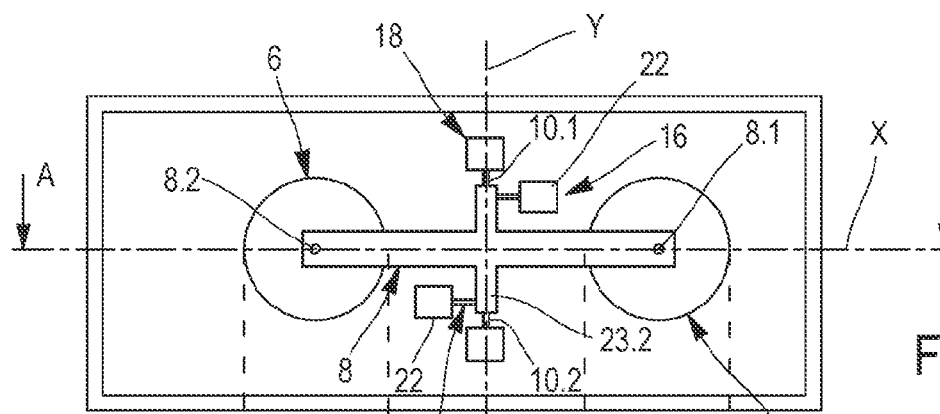
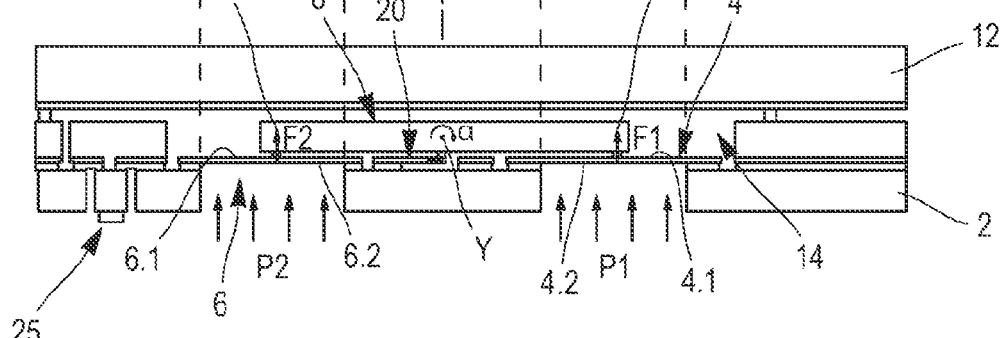
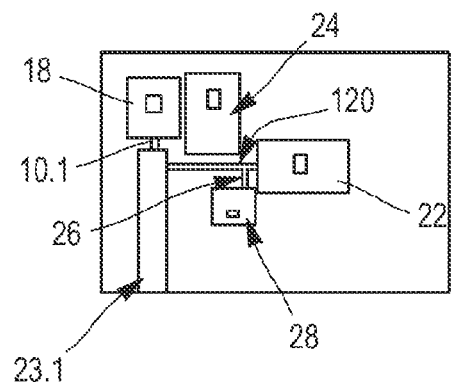 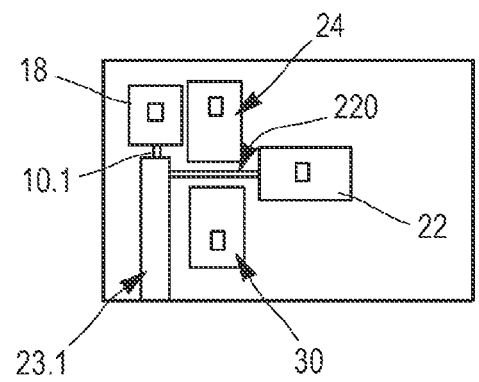

MICROELECTROMECHANICAL AND/OR NANOELECTROMECHANICAL DIFFERENTIAL PRESSURE MEASUREMENT SENSOR

TECHNICAL FIELD AND PRIOR ART

The present invention relates to a microelectromechanical and/or nanoelectromechanical differential pressure measurement sensor.

A differential pressure measurement sensor makes it possible to measure a difference between two pressures, said two pressures being any pressures.

In the microelectronics and nanoelectronics field there exist several types of differential pressure measurement sensor.

The document *J. Micromech. Microeng.* 22 (2012) 055015—H Takahashi et al. describes a cantilever type beam with piezoresistive detection for measuring the pressure difference between the two sides of the beam. A pressure difference induces a deflection of the beam which is measured using a piezoresistive gauge, the variation in electrical resistance is proportional to the pressure difference. This sensor is of relatively simple structure, nevertheless due to the formation of the beam the two sides at different pressures are in communication. In order to limit leaks between the two sides of the beam, air gaps of nanometric size are formed, but a leak remains between the two sides of the beam.

Furthermore, the piezoresistive gauge(s) are in contact with the gas or the liquid coming into contact with the beam. This sensor may thus pose problems of reliability.

Finally this embodiment makes it necessary to form pressure inlets on the two sides of the beam, which may make the assembly complex.

In order to avoid the presence of a leak between the two sides of the sensitive element, differential pressure sensors implement a sealed membrane. For example the document "*Capacitive differential pressure sensor for harsh environments*"—S. T. Moe & Al.—*Sensors and Actuators* 83 (2000), pp 30-33 describes a capacitive differential pressure measurement sensor comprising a stack of three substrates. One substrate forms the membrane, which is deformed under the effect of a differential pressure between its two faces. The membrane forms with the intermediate substrate a variable capacitance capacitor, the measurement of said capacitance makes it possible to determine the differential pressure. A reference capacitance, which is insensitive to the differential pressure makes it possible to compensate the variations in capacitance caused by ambient pressure and temperature variations. This sensor is of complex manufacture due to the stacking of three substrates. Furthermore, the variable capacitance capacitor is in contact with one of the fluids for which the pressure is detected. Thus, in the case of a liquid, this may cause a short-circuit between the two plates of the capacitor.

The document P. D. Dimitropoulos et al./*Sensors and Actuators A* 123-124 (2005) 36-43 describes a differential pressure measurement sensor implementing two membranes delimiting between them a sealed cavity. One face of each membrane is subjected to a pressure, the differential pressure between the two faces of the sensor induces a deflection of the two membranes. The two membranes form a variable capacitance capacitor, the measurement of said capacitance makes it possible to determine the pressure between the two faces.

This sensor has the advantage that the variable capacitance capacitor is protected from the exterior environment. On the other hand, this pressure measurement sensor measures the sum of the pressures applied to the two membranes and not the difference between the pressures applied to each of the membranes. Moreover, the two membranes are separate since they are not derived from the same layer and are formed during different steps. They may then have different sensitivities and different variations with respect to external perturbations, such as the temperature, vibrations . . . . The precision of the sensor is thereby reduced.

Moreover, this sensor imposes pressure inlets on both sides of the assembly of two membranes.

DESCRIPTION OF THE INVENTION

It is consequently an aim of the present invention to offer a differential pressure measurement sensor of simple and robust realisation.

The aim of the present invention is attained by a differential pressure measurement sensor comprising a first membrane subjected to a first pressure on one face and a reference pressure on another face, a second membrane subjected to a second pressure on one face and to the reference pressure on another face and a beam linking the two membranes on the side of the faces subjected to the reference pressure, the beam being articulated on a support by a pivot link, and measurement means sensitive to the movement of the beam caused by the difference in pressure seen by the two membranes.

The pivot link is shifted with respect to the rigid beam. It is distinct from the rigid beam and its cross-section is different from the cross-section of the rigid beam. This pivot link is connected to the rigid beam between the two areas to which the membranes are secured. The axis of the pivot link is orthogonal the rigid beam.

The sensor offers great robustness since the measurement means are isolated in the cavities to the reference pressures, they are not then in contact with the exterior environment. The risks of short-circuit and/or of corrosion are avoided. Moreover, it makes it possible, by taking the same reference pressures for the two membranes, to measure directly the differential pressure. In fact, the implementation of the beam makes it possible to cancel static pressure in the measurement and thus provide a differential pressure value directly. The sensor according to the invention thus has an advantage in terms of measurement dynamic compared to differential pressure sensors implementing absolute pressure sensors.

In other words, an intermediate element is implemented which undergoes the push forces of each of the membranes, due to its judicious rotational articulation with respect to the substrate, its rotational movement corresponds to the difference in the push forces undergone by the membranes. By measuring the rotational movement of the intermediate element it is possible to deduce therefrom the differential pressure.

The implementation of the beam can advantageously make it possible to benefit from a lever-arm effect making it possible to increase the sensitivity of the sensor. In fact, in the case of detection means with strain gauges connected to the axis of rotation of the beam, the push force applied by each membrane to the beam is amplified, this then results in an amplified movement of the beam and an amplified strain in the gauge(s). The sensor then has enhanced sensitivity. The longitudinal ends of the beam are in permanent contact with the membranes. They may be solidly connected to the membranes by a rigid or flexible link or be uniquely in "sliding" contact with the membranes.

In addition to the implementation of this beam which is articulated and subjected to the push forces of the two membranes, a differential capacitive measurement may easily be implemented, unlike other differential pressure measurement sensors with capacitive detection.

In a very advantageous manner, the two membranes have identical structures and are formed simultaneously. They then have similar or even identical sensitivities and undergo the same variations to external perturbations, such as temperature variations, vibrations. The sensor may then offer high precision.

The sensor according to the invention may be easily formed using surface technology, and may then be co-integrated with inertial sensors formed using surface technology.

The subject-matter of the present invention therefore is a MEMS and/or NEMS differential pressure measurement sensor comprising at least one first membrane and at least one second membrane, each suspended from a substrate, the first membrane having a face subjected to a reference pressure and a second face subjected to a first pressure to be detected, the second membrane having a first face subjected to the reference pressure and a second face subjected to a second pressure to be detected, a rigid beam of longitudinal axis articulated with respect to the substrate by a pivot link around an axis, said beam being in contact via a first zone to the first membrane and via a second zone to the second membrane such that the pivot link is situated between the first zone and the second zone of the beam, means of measuring the movement of the beam around the axis, said measurement means being arranged at least in part on the substrate.

The pivot link is in a plan parallel to and distinct from the plan of the membranes. In ace of detection by strain gauge (s), the strain gauges can be in the plane of the membranes.

The distance between the plane of the pivot link and the plane of the membranes is equal approximately to the half of thickness of the rigid beam, for example few tenths of μm.

The membranes are arranged on the same face of the substrate. They may be arranged in the same plane or in different planes, in particular in the case of thinning or thickening of one of the membranes, for example by the deposition of an additional layer.

The sensor may comprise a cap delimiting with the substrate on the side of the first faces of first and second membranes at least one hermetic cavity.

Preferably, the measurement means are arranged in the cavity or the cavities.

The axis of rotation may be situated at the centre of the beam and the first and second contact zones between the beam and the first and second membranes respectively are then advantageously at equal distance from the axis of rotation.

Preferably, the contact between the beam and the membranes takes place in the vicinity of the centre of the membranes, at the spot where the deformation of the membranes is maximal. The area corresponding to the vicinity of the centre of the membranes is, in the present application, the area which, from the centre of the membrane, has a radius equal to or less than 10% of the radius of the membrane.

The beam may be solidly connected to the membranes or in sliding contact with said membranes at the level of the contact zones.

The first membrane and the second membrane advantageously have the same thickness and the same surface area.

The beam may be solidly connected to the first and/or the second membrane by a flexible link along the longitudinal axis of the beam and rigid along an axis of deformation of the first and/or the second membrane.

In an example of embodiment, the pivot link is formed by at least one beam parallel to the axis of rotation and subjected to torsional stress.

In another example of embodiment, the pivot link is formed by at least one beam parallel to the longitudinal axis and subjected to bending stress.

It may be envisaged to form the pivot link by combining a torsion link comprising one or two beams subjected to torsional stress and a bending link comprising one or two beams subjected to bending stress.

According to an additional characteristic, the sensor may comprise means for stiffening the first membrane and/or the second membrane, for example formed by over-thickness zones on the first membrane and/or the second membrane, for example arranged radially or in a honeycomb.

The sensor may comprise several first membranes subjected to the first pressure, and/or several second membranes subjected to the second pressure, the beam being in contact with the first membranes and second membranes.

The sensor may advantageously comprise at least one stop arranged facing the first membrane and/or the second membrane, opposite the face of the first membrane and/or the second membrane subjected to the pressure to detect so as to limit the deformation of the first membrane and/or the second membrane. The stop may be connected to an electrical connection. The stop may thus serve as actuating electrode, for example to carry out a self-test and/or electrode making to possible to place the stop at the same potential as the membrane and thus avoid short-circuits in the event of pressure shock and/or polarisation electrode to obtain a negative stiffness effect, in order to reduce the stiffness of the system and to increase its sensitivity.

The measurement means may comprise at least one suspended strain gauge connected by one end to the substrate by an anchoring pad and secured to the beam in the vicinity of the axis of rotation such that a rotational movement of the beam around the axis of rotation applies a strain to said gauge, said gauge having an axis arranged below or above the axis of rotation.

This configuration may be obtained advantageously by thinning the gauge(s), for example the gauge(s) have a thickness less than or equal to the half-thickness of the pivot axis.

Preferably, the measurement means comprise two strain gauges on either side of the longitudinal axis of the beam.

In an example of embodiment, the strain gauge(s) is or are for example piezoresistive gauges, advantageously made of piezoresistive material.

In another example of embodiment, the strain gauge(s) is or are resonant gauges and the measurement means comprise means of exciting the resonant gauge and means of measuring the variation in vibration of the resonant gauge.

In another example of embodiment, the measurement means are capacitive measurement means. The capacitive measurement means may comprise two pairs of electrodes, a first pair comprising a fixed electrode and a facing moving electrode, the moving electrode being borne by the beam, and a second pair comprising a fixed electrode and a facing moving electrode, the moving electrode being borne by the beam in a zone opposite to the zone bearing the moving electrode of the first pair with respect to the axis of rotation.

In a variant, the capacitive measurement means may comprise two pairs of electrodes, a first pair comprising a fixed electrode and a facing moving electrode, the moving electrode being borne by the first membrane and the fixed electrode being borne by a stop facing the first membrane, and a second pair comprising a fixed electrode and a facing moving electrode, the moving electrode being borne by the second membrane and the fixed electrode being borne by the stop facing the second membrane.

One or more electrical contacts may be formed in the cavity or the cavities, and one or more electrical connections connected to the electrical contact(s) of through via type are formed through the cap.

One or more electrical contacts may be formed in part inside the cavity or the cavities and in part outside the cavity or the cavities, and one or more electrical connections are connected to the electrical contact(s) outside of the cavity or cavities.

Another subject-matter of the present invention is a MEMS and/or NEMS assembly comprising at least one differential pressure measurement sensor according to the invention and at least one inertial sensor formed on and in the same substrate.

Another subject-matter of the present invention is a differential pressure measurement device comprising at least one differential pressure measurement sensor according to the invention and a case in which is mounted the differential pressure measurement sensor, said case comprising two separate pressure ports each being connected to said differential pressure measurement sensor such that a pressure port emerges on the second face of the first membrane and the other pressure port emerges on the second face of the second membrane.

In an example of embodiment, the two pressure ports may be on one face of the case.

In another embodiment example, the two pressure ports are on two faces of the case, opposite with respect to the pressure measurement sensor. The pressure to which one of the membranes is subjected arrives laterally, via the air gap formed by the thickness of the sealing bead (open at least partially) and/or through the intermediary of a space etched in the substrate.

BRIEF DESCRIPTION OF THE DRAWINGS

The present invention will be better understood by means of the description that follows and the appended drawings in which:

FIGS. 1A and 1B are top and sectional views along the line A-A respectively of an example of embodiment of a differential pressure measurement sensor with detection by suspended piezoresistive strain gauge according to the invention, FIG. 1C is a schematic representation of a detail of the measurement means by suspended resonant strain gauge with capacitive excitation and piezoresistive measurement of the resonance of the gauge, FIG. 1D is a schematic representation of a detail of the measurement means by suspended resonant strain gauge with capacitive excitation and capacitive measurement of the resonance.

DETAILED DESCRIPTION OF PARTICULAR EMBODIMENTS

Figure 2A:
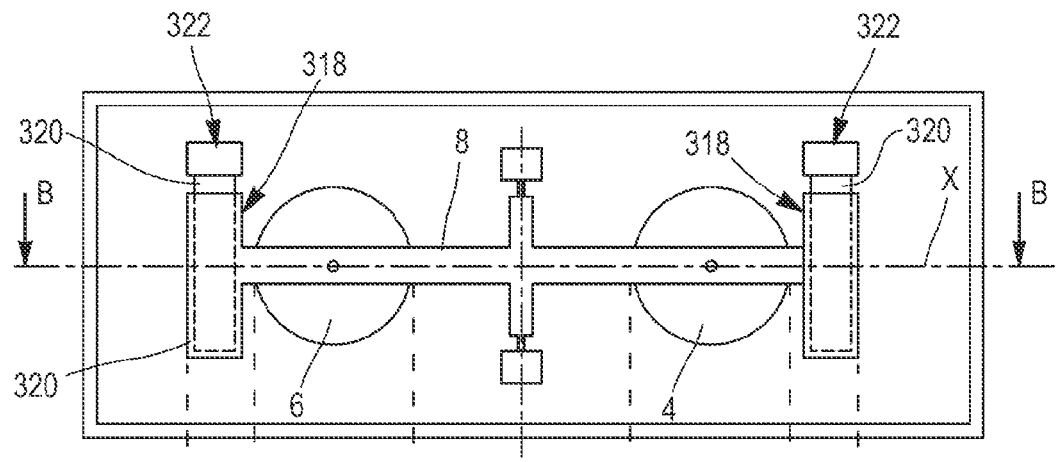
FIGS. 2A and 2B are top and longitudinal sectional views along the line B-B respectively of an example of embodiment of a differential pressure measurement sensor with capacitive detection according to the invention.

In the description that follows, the sensors are of MEMS and/or NEMS type, however they will be designated uniquely by the term "sensor" for reasons of simplicity.

Elements and parts having the same function and the same shape will be designated by the same references.

The differential pressure measurement sensor is intended to measure the pressure difference between the pressures P1 and P2.

FIGS. 1A and 1B are top and sectional views respectively of an example of embodiment of a differential pressure measurement sensor, comprising a substrate 2, two separate membranes 4, 6 suspended from the substrate.

Each membrane 4, 6 is such that it deforms under the action of a pressure difference on its two faces.

In the example represented, the membrane 4 is subjected on one of its faces 4.1 to a reference pressure REF and on the other of its faces 4.2 to the pressure P1.

The membrane 6 is subjected on one of its faces 6.1 to the reference pressure REF and on the other of its faces 6.2 to the pressure P2.

In the example represented, the two membranes are subjected to the same reference pressure. But a sensor with different reference pressures does not go beyond the scope of the present invention.

In the example represented, a cavity 14 hermetic to gases is made in which reigns the reference pressure PREF.

In the example represented, the membranes 4, 6 have the shape of a disc but they could have any other shape, such as a square shape, hexagonal shape . . . . They could also have different shapes to each other. Preferably, the membranes are flat, preferably are coplanar and preferably are of same thickness.

A beam 8 of axis X is mounted articulated around a pivot link 10 of Y axis on the substrate. The Y axis is in the example represented perpendicular to the X axis. In the example represented, the beam is of rectangular section but it could be of trapezoidal section for example. The pivot link 10 is shifted with respect to the beam 8.

In the example represented, the pivot link 10 comprises two beams 10.1, 10.2 each connecting a lateral edge of the beam 10 to an anchoring pad forming advantageously an electrical contact 18. The two beams are aligned along the Y axis. The beams 10.1, 10.2 are subjected to torsional stress around the Y axis. The pivot link may comprise a single beam subjected to torsional stress as will be described below.

The beam 8 is solidly connected by each of its longitudinal ends 8.1, 8.2 to the face 4.1, 6.1 of the membrane 4, 6 respectively. The beam rigidly links the two membranes in comparison with the stiffness of the membranes. It may be envisaged that the beam is solidly connected to the membranes 4, 6 at the level of an intermediate zone between its longitudinal end and the axis of rotation Y.

It will be seen that in the case of measurement means with strain gauges, the greater the distances between the points of application of the forces on the beam and the greater the axis of rotation Y, the greater the sensitivity.

In the present application, for reasons of simplification, "substrate" is taken to mean the support substrate 2 and the layers arranged on said support substrate such as for example the layer(s) in which are formed the membranes and the beam 8.

A cap 12 is assembled on the substrate 2 on the side of the beam and defines with the substrate and the membranes the sealed cavity 14 in which is established the reference pressure REF. In the case where each of the membranes would be subjected on one face to a different reference pressure, the cap 12 would delimit two hermetic cavities with each membrane and the substrate.

Advantageously, the cap 12 is sealed onto the substrate under vacuum by sealing, for example by eutectic sealing, anodic sealing, molecular sealing or SDB ("Silicon Direct Bonding"), molecular sealing or SBD using surface forces and Van der Waals forces), . . . , which makes it possible to obtain a good quality of vacuum, which is more reliable for example compared to plugging by deposition.

Moreover, this formation of the cavity or the cavities directly by sealing of the cap makes it possible to insert a getter material into the reference cavity or cavities, for example in the case where it is wished to have an intensive reference vacuum and which is stable over time.

The sensor also comprises means of measuring 16 the movement of the beam around the Y axis, which makes it possible to work back to the difference in this pressure P1-P2. The measurement means are shifted with respect to the membranes.

In the example represented, the measurement means are formed by two suspended strain gauges 20, situated on either side of the beam 8.

A gauge 20 is suspended between an anchoring pad 22 and an element 23.1 of Y axis aligned with the torsion beams 10.1, 10.2, projecting from a lateral edge of the beam. The other gauge 20 is suspended between an anchoring pad and electrical contact 22 and an element 23.2 of Y axis aligned with the torsion beams 10.1, 10.2, projecting from the other lateral edge of the beam 8.

The elements 23.1, 23.2 are fixed with respect to the beam 8 such that the rotation of the beam 8 corresponds to that of the elements.

Electrical contacts 25 are advantageously in the anchoring plots making it possible to supply the strain gauges. In a variant, it could be envisaged to form electrical contacts separate from the anchoring pads and the formation of a connection between the electrical contacts and the gauges.

In the example represented, the electrical contact 25 is formed on the rear face of the substrate 2. It corresponds to the contact pads 22, 16, 18. In order to simplify the representation, it is shifted. But it is in practice formed directly in line with each of the electrical contacts of the sensor. The electrical contact on the rear face is a through contact or via or TSV (Through Silicon Via).

When the beam 8 pivots around the Y axis, the strain gauges 20 are deformed. The beam transforms the differential deflection of the membranes into a strain on the gauges. The differential deflection is amplified thanks to the beam forming a lever arm.

The strain amplified by the beam 8 then applies on the longitudinal ends of the gauges The bending stiffness of the beam outside of the plane of the substrate of the beam 8 is preferably at least 10 times greater than the compressive stiffness of the gauge(s), which makes it possible to avoid a deformation of the beam and a reduction of the deformation transmitted to the beam. In the example represented, the gauges 20 are arranged on either side of the axis of rotation Y and of the beam 8. The measurement means could only comprise a single strain gauge. The implementation of two strain gauges makes it possible to carry out differential measurements, rendering the device less sensitive to external variations, for example to temperature variations.

Advantageously, the gauge(s) have a nanometric section, which makes it possible to have a higher concentration of strain and thus enhanced sensitivity.

In FIGS. 1A and 1B, the strain gauges are of piezoresistive type. The variation in resistance due to the strain that is applied to them makes it possible to deduce the movement of the beam around the Y axis and thus the pressure difference P1-P2.

The gauges are oriented such that their sensitive axis is substantially parallel to the beam and thus that it is substantially orthogonal to the axis of rotation of the linking arm. They are arranged advantageously as near as possible to the axis of rotation Y such that the axis of rotation Y is close to the point of application of the strain on the gauges. In fact, the amplification of the strain by the lever arm is all the greater when the axis of rotation is close to the point of application of the strain on the gauge.

Furthermore, the neutral line of each gauge is arranged above or below the axis of rotation of the transmission arm. To achieve this, the gauges may have a thickness less than that of the torsion and/or bending beam. For example to obtain this lower thickness from the same layers, it is possible to deposit an over-thickness on said beams.

In FIGS. 1C and 1D may be seen examples represented schematically of resonant type strain gauges.

In FIG. 1C, the resonant gauge 120 is suspended between the torsion beam 10.1 and the anchoring pad 22 forming electrical contact. An excitation electrode 24 is provided along one side of the resonant gauge 120 to place it in vibration. Piezoresistive means of measuring the vibration of the resonant gauge 120 are provided. It is in the example represented a piezoresistive gauge 26 suspended between the resonant gauge 120 and an anchoring pad 28 comprising advantageously an electrical contact.

The excitation electrode places in vibration the resonant gauge 120 and the variation in the vibration frequency due to the strain that is applied to the resonant gauge 120 is measured by the piezoresistive gauge 26.

In FIG. 1D, the detection of the variation in the vibration frequency of the resonant gauge 220 is realised in a capacitive manner. The measurement means comprise an excitation electrode 24 and a detection electrode 30 forming with the resonant gauge 220 a variable capacitance capacitor. The measurement of the variation in capacitance is a function of the variation in the vibration frequency of the resonant beam 220 which depends on the strain that is applied thereto.

The operation of the pressure measurement sensor of FIGS. 1A and 1B will now be described.

When a pressure difference arises between the face 4.2 of the membrane 4 and the face 6.2 of the membrane 6, a force F1 is applied to the end 8.1 of the beam, proportional to the pressure P1, and a force F2 is applied to the end 8.2 of the beam proportional to the pressure P2. In considering that the forces are of different intensities but of same direction, for example towards the inside of the reference pressure cavity, the beam 8 tips around the Y axis. If P1 is greater than P2, the beam pivots counter-clockwise and if P2 is greater than P1, the beam pivots clockwise.

This tipping has the effect of applying a strain to the strain gauges 20, 20. This strain is amplified due to the lever-arm effect. The strain undergone by the gauges 20, 20 is then measured with the means described above. These measurements then make it possible to determine the pressure difference between P1 and P2.

In the case where the reference pressure is the same for the two membranes, the differential pressure measurement sensor makes it possible to supply the differential pressure P1-P2 directly.

The differential pressure measurement sensor makes it possible to measure pressure differences whether the pressures P1 and P2 are greater than or less than or equal to PREF.

The amplification of the strain by the lever arm will be all the greater when the length of the arm between the point of application of the force by the membranes and the axis of rotation Y is high, when the axis of rotation is close to the point of application of the strain on the gauges. The smaller the section of the gauges (thickness, width), the higher will be the strain.

Thus, the sensitivity of the sensor is increased. It is thus possible to offer more efficient sensors or then to reduce the size of the sensors, for example by reducing the surface area of the membranes, while maintaining the same performance.

Figure 2B:
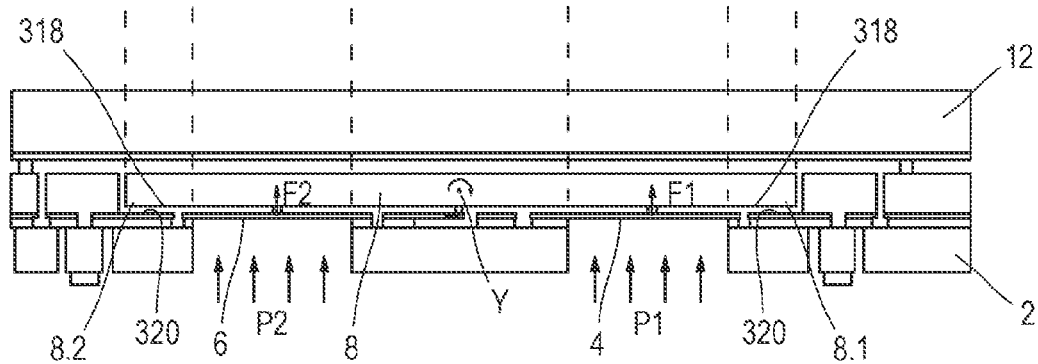

In FIGS. 2A and 2B may be seen another example of embodiment of a differential pressure measurement sensor in which the detection is of capacitive type. These means are shifted with respect to the membranes.

This sensor differs from that of FIGS. 1A and 1B in that the measurement means 316 are of capacitive type.

In a preferred manner, it is a differential measurement. To achieve this, a variable capacitance capacitor is provided on each arm of the beam 8 on either side of the axis of rotation Y, supplying two capacitance measurements. The beam 8 bears a moving electrode 318 common to the two differential capacitance capacitors; two fixed electrodes 320 (represented in dotted lines) are provided on the substrate facing the moving electrode 318 on the two arms of the beam. Each fixed electrode is connected to an electrical contact 322 connected to a polarisation source and the contact of the moving electrode 318 takes place via the contact of the beam, for example at the level of the embedding of the torsion axis (plot 18 in FIG. 1A). The moving electrodes 318 have an out of plane movement and move away or come closer to the fixed electrodes 320. Advantageously the moving electrode 318 is arranged at the longitudinal end 8.1, 8.2 of the beam 8 the furthest from the Y axis in order to have an increased movement of the moving electrode with respect to the fixed electrode and thus increased measurement sensitivity.

In a variant, a single variable capacitance capacitor on one or the other of the arms could be provided.

The amplification of the movement of the moving electrode (with respect to the fixed electrode) by the lever arm will be all the higher when:
  the length of the arm between the point of application of
    the force by the membrane and the axis of rotation is
    small,
  the moving electrode is far from the axis of rotation Y.

In this example, the beam is solidly connected to the membranes in an intermediate zone between the axis of rotation Y and the longitudinal ends 8.1, 8.2.

When the membranes 4, 6 are deformed, the beam carries with it the moving electrodes, which move with respect to the fixed electrodes. The air gap distance between the electrode pairs varies, each variation in air gap is representative of the differential strain applied by the membranes and thus the pressure difference P1-P2. In the case of capacitive detection, the realisation of a differential measurement is easy.

Thanks to the implementation of the beam 8, the movement of of the moving electrode(s) may be amplified compared to that of the membranes 4, 6. Thus, for a given pressure difference, the variation in capacitance is increased. The sensitivity of the differential pressure measurement sensor is thus enhanced.

Advantageously, the variable capacitance capacitor(s) may also be used as actuation means to carry out a "self-test" or a self-calibration of the sensor. The implementation of these electrodes can also make it possible to enslave in position the membranes, and enable an enslaved measurement mode. This type of actuation ("self-test" function, enslavement) may advantageously be coupled to the piezoresistive detection mode described previously.

Figure 6:
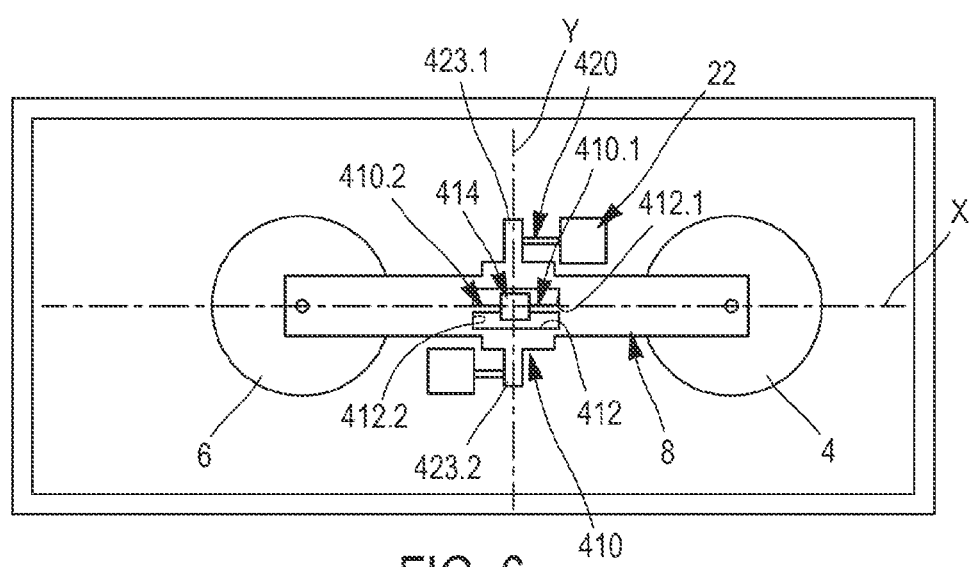
FIG. 6 is a top view of an example of embodiment of a differential pressure measurement sensor in which the pivot axis is obtained by beams working through bending.

In FIG. 6 may be seen a variant of embodiment of the pivot link 10, in which the pivot link 410 is formed by means of beams working through bending. To achieve this, the beam comprises a hollowing out 412 in the zone where the pivot link is to be formed. The hollowing out forms a window comprising two opposite edges 412.1, 412.2 perpendicular to the X axis. Two beams 410.1, 410.2 substantially aligned along the X axis connect an embedding pad 414 to the two edges 412.1, 412.2. The beams 410.1, 410.2 are dimensioned such that the axis of rotation Y is situated on the anchoring block.

The beam 8 comprises two lateral projections 423.1, 423.2 aligned with the Y axis to which are suspended the strain gauges 420 of measurement means. The piezoresistive or resonant measurement means are similar to those described in relation with FIGS. 1A to 1D. More than two bending beams, for example four, may be implemented. Moreover, this link to bending beam may apply to a sensor with capacitive detection.

Figure 3:
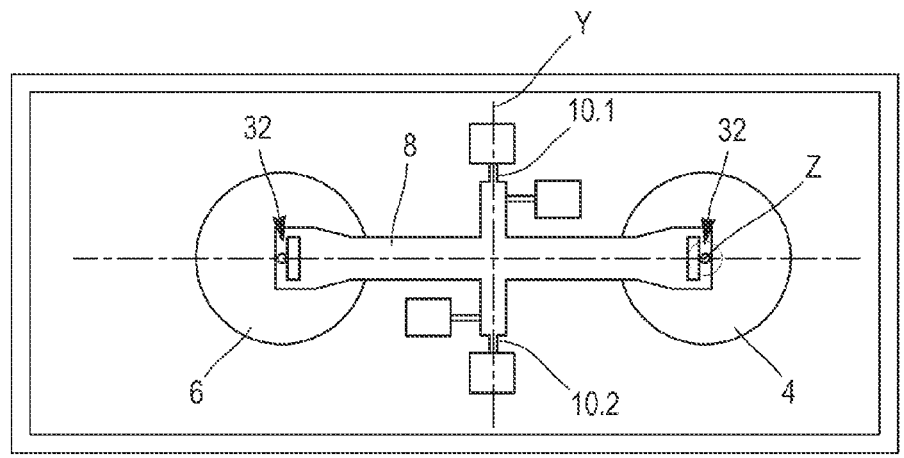
FIG. 3 is a top view of an example of embodiment of a pressure measurement sensor comprising a flexible articulation along the X axis and rigid along the Z axis between the membranes and the beam.

In FIG. 3 may be seen an example of embodiment of a differential pressure measurement sensor that differs from the examples of FIGS. 1A to 1D and 2A and 2B in that it advantageously comprises a flexible articulation 32 between the membrane 4, 6 and the beam 8. This articulation is of spring or bending beam type. In FIG. 3 it is a bending beam 34 which makes it possible to transmit entirely the force along a Z axis orthogonal to the X and Y axes induced by the deformation of the membranes, while limiting the parasitic force along the X axis, i.e. along the axis of the beam 8 due to this deformation. This link has a certain flexibility along the X axis so as not to hinder the deformation of the membrane, and a certain rigidity along the Z axis to transmit the entire deformation of the membrane to the arm.

Figure 4:
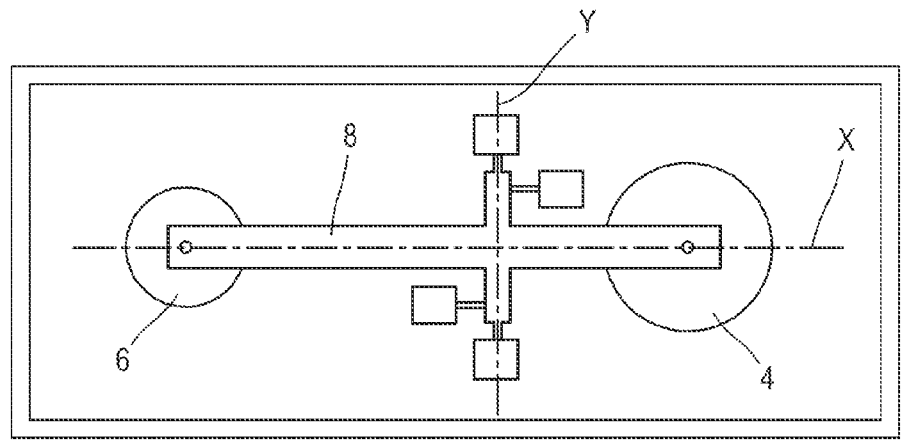
FIG. 4 is a top view of an example of embodiment of a differential pressure measurement sensor in which the pivot axis of the beam is off centre and the membranes have different diameters.

In FIG. 4 may be seen an example of embodiment of a differential pressure measurement sensor according to the invention offering a dissymmetrical configuration. For example, the membrane 4 has a greater surface area than the membrane 6. In order to compensate for this difference on the beam, the axis of rotation Y is shifted towards the membrane 4 which has the effect of increasing the amplification of the force applied to the membrane 6 and facilitates the treatment of measurements.

In a variant, the sensor could comprise membranes of different surface area and a pivot axis at the centre of the beam and conversely membranes of same surface area but a pivot axis moved off centre.

Figure 5A:
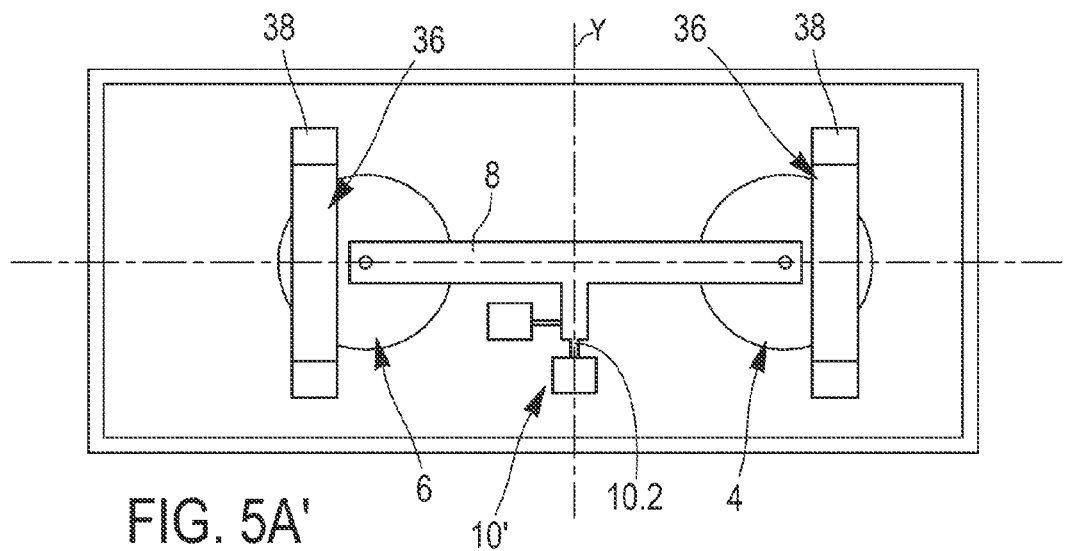
FIGS. 5A and 5B are top and sectional views along the line C-C respectively of another example of embodiment of a differential pressure measurement sensor comprising stops, FIG. 5A' is a top view of a variant of the sensor of FIG. 5A in which the pivot link comprises a single beam subjected to torsional stress.
Figure 5A:
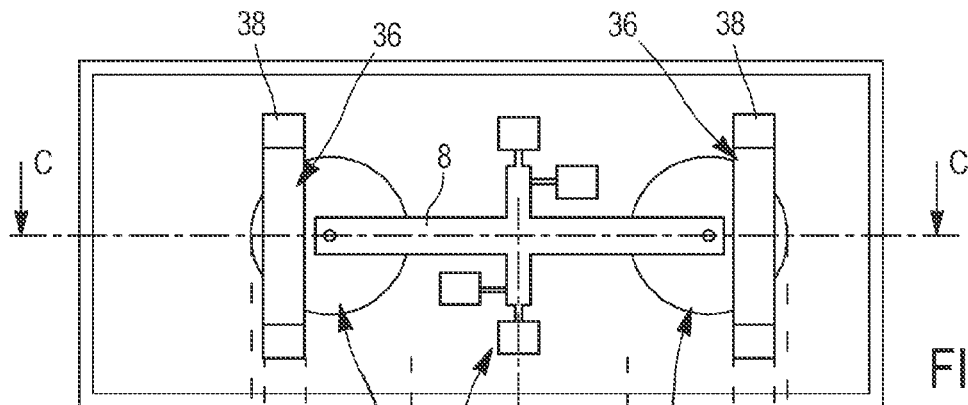
Figure 5B:
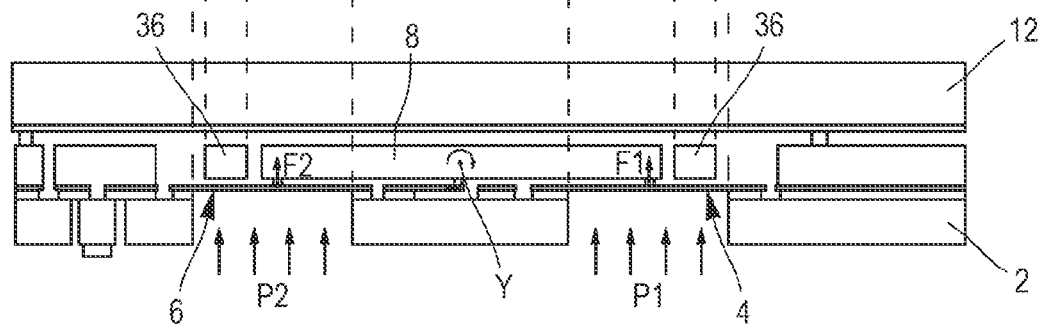

In FIGS. 5A and 5B may be seen another example of differential pressure measurement sensor with detection by strain gauge in which mechanical stop means are implemented between the membranes 4, 6 and the cap.

The stops 36 serve to limit the movement of the membranes 4, 6, and thus that of the beam 8, to protect the strain gauges. In fact, in the case of pressure shock, the pressure experienced by the membranes may go beyond the measurement range provided at manufacture, and the membranes 4, 6 via the beam 8 may apply a strain greater than the strain that the gauge(s) can withstand. In the example represented, the stops are formed by beams of axis parallel to the X axis and anchored on the substrate, they overlap the membranes 4, 6.

It is thus possible to set simply the level of pressure from which the movement of the membrane and thus of the arm, is limited, by positioning the stops 36 more or less near to the zones of the membranes having the maximum deformation.

It may be envisaged that the stops are above the beam and form directly a stop for the beam, for example in the case where the stops are formed directly by the cap 12 or on the cap above the beam. It may be envisaged that a single stop is implemented, for example above the membrane the most likely to experience a pressure shock.

An electrical contact 38 may be added onto the anchoring pad of the stop in order to control the potential of the stop, for example the stop may be at the potential of the membrane, which makes it possible to avoid the risk of short-circuit in the case of contact of the membrane on the stop and the risk of a parasitic electrostatic attraction of the membrane towards the stop.

Alternatively, it may be envisaged that each stop forms a measurement and/or actuating electrode for the facing membrane, for example to assure a self-test, self-calibration function, or instead to assure an enslavement in position of the beam 8. The enslavement is obtained by applying an electrostatic retraction force counteracting the pressure force exerted on the membranes. The enslavement also makes it possible to increase the measurement range, i.e. the maximum pressure difference to be measured, for a given sensitivity of the sensor.

In FIG. 5A', a variant of FIG. 5A may be seen in which the pivot link 10' is formed by a single beam 10.2 subjected to torsional stress.

Figure 9:
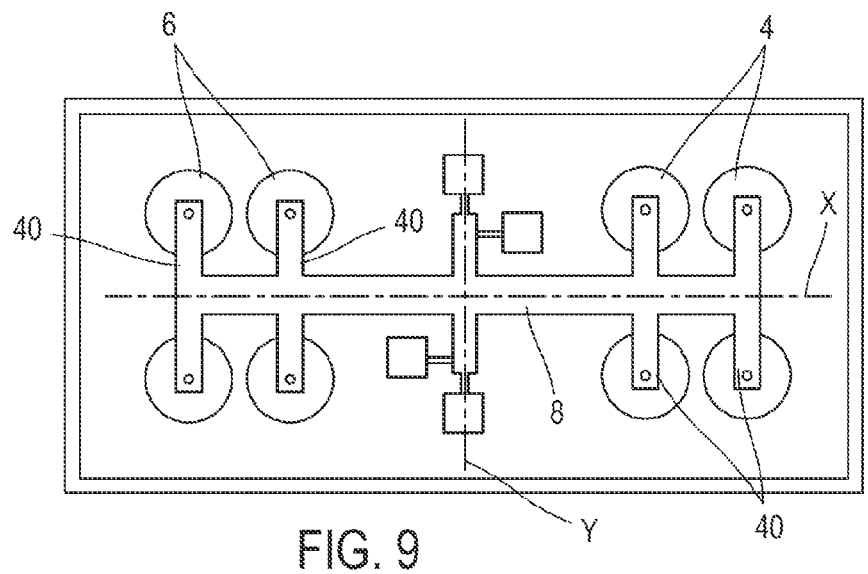
FIG. 9 is a top view of another example of embodiment of a differential pressure measurement sensor with detection by strain gauge in which several membranes are used to detect each pressure.

In FIG. 9, another example of embodiment of a differential pressure measurement sensor may be seen in which each pressure P1, P2 is applied to several membranes 4, 6 respectively, the beam 8 being connected to each of the membranes 4.

In the example represented, the sensor comprises two sets of four membranes 4, 6 arranged on either side of the Y axis. The four membranes 4 are arranged by pairs on each side of the X axis, and the four membranes 6 are arranged by pairs on each side of the X axis.

The beam 8 comprises two parallel transversal elements 40 on each arm, extending on either side of the beam 14 and connected in the vicinity of their ends to a membrane 4, 6

Deformations of the four membranes 4 apply a force to an arm of the beam 8 and the four membranes 6 apply a force to the other arm of the beam 8. The total surface area of four membranes being greater than that of a single membrane, the force applied to the beam, and thus to the gauges, is increased. This embodiment is particularly interesting for strain gauge sensors, such as piezoresistive or resonant gauges.

Thus it is possible to increase the force applied to the beam by adding up the forces applied to several membranes. It will be understood that the number of membranes subjected to the pressure P1 and the number of membranes subjected to the pressure P2 may be different to each other. For example, several small membranes 4 and a single large membrane 6 or vice-versa could be provided.

Figure 10:
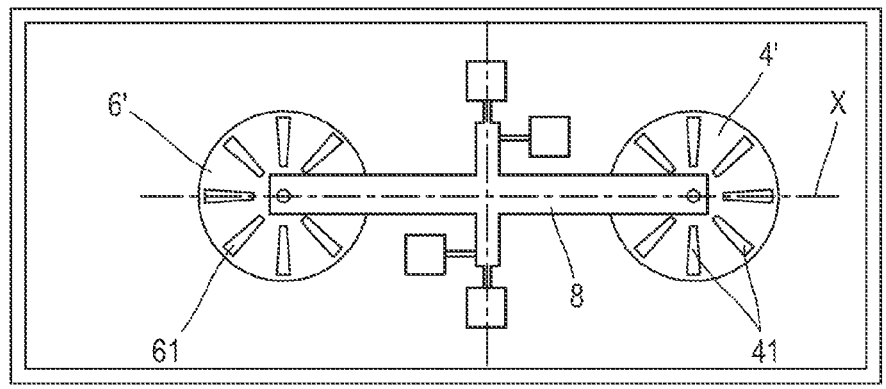
FIG. 10 is a top view of another example of embodiment of a differential pressure measurement sensor with detection by strain gauge having elements for stiffening the membranes to limit parasitic deformations.

In FIG. 10 may be seen another example of embodiment of a differential pressure measurement sensor in which the membranes 4, 6 have a locally enhanced rigidity in order to reduce the deformation of the membranes 4, 6 to the benefit of the strains applied to the beam and to the strain gauge(s). The sensitivity of the sensor may thus be optimised.

In the example represented, the membranes 4', 6' are locally stiffened in the zone of large deformation by adding radial over-thicknesses 41, 61 onto the membranes 4, 6 having a similar structure to umbrella ribs. A honeycomb structure may also be suitable or any other means increasing the rigidity of the membrane. The level of stiffening is chosen in order to avoid rendering the sensor too sensitive to accelerations. Only one of the two membranes can have such stiffening means.

Figure 11:
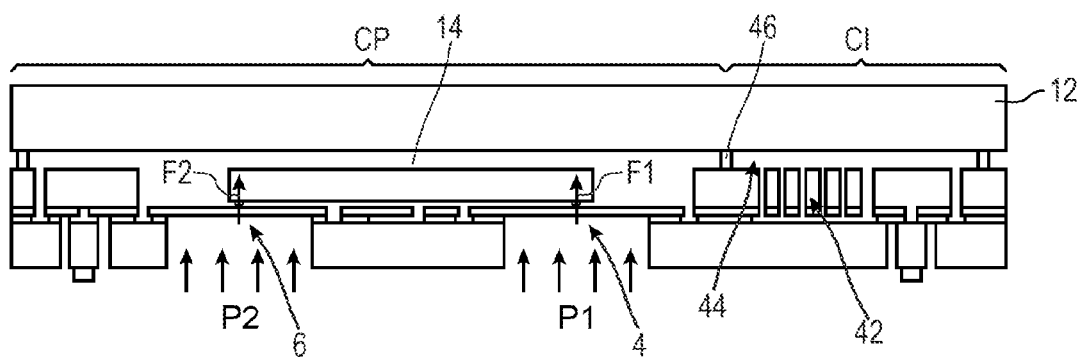
FIG. 11 is a longitudinal sectional view of an assembly integrating a differential pressure measurement sensor according to the invention and an inertial sensor.

In FIG. 11 may be seen an example of integration of a differential pressure measurement sensor according to the invention and an inertial sensor. This integration is rendered possible by the fact that the differential pressure measurement sensor CP according to the invention may be formed with technologies for manufacturing inertial sensors, such as accelerometers or gyrometers formed using surface technology.

In FIG. 11 may be seen the differential pressure measurement sensor CP (on the left in the representation of FIG. 11) and an inertial sensor CI (on the right in the representation of FIG. 11) comprising capacitive interdigitated combs 42, formed in the same substrate as that of the pressure measurement sensor.

The inertial sensor could in a variant be of the strain gauge type.

In the example represented, the encapsulation of the inertial sensor CI is obtained by the formation of a cavity 44 separate from the cavity 14 of the differential pressure measurement sensor, a sealing bead 46 separating them. It may be envisaged to form only a single cavity for the two sensors CP and CI, since said cavity is at a reference pressure.

The differential pressure measurement sensor according to the invention implements identical technologies to the technologies of manufacturing micro and nanoelectromechanical inertial sensors with interdigitated combs or with suspended strain gauges. It is then possible to pool together a large part of existing methods and to jointly integrate a differential pressure measurement sensor and one or more micro and nanoelectromechanical systems.

Figure 7A:
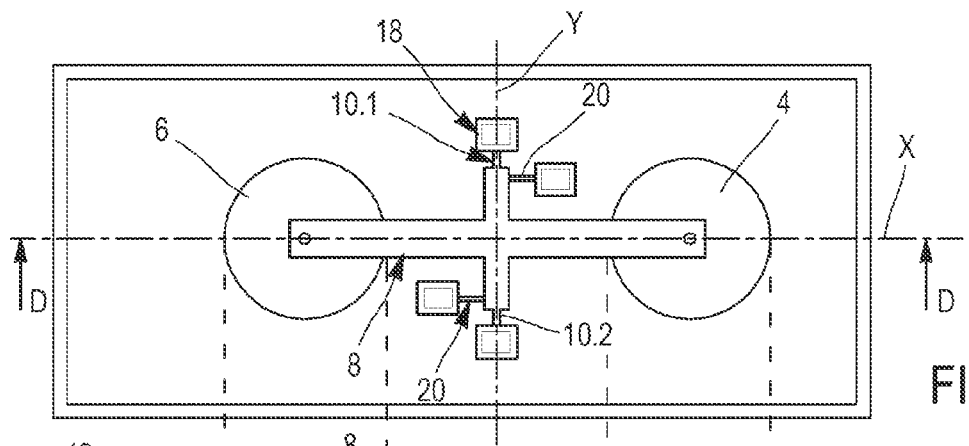
FIGS. 7A and 7B are top and sectional views along the line D-D respectively of another example of embodiment of a differential pressure measurement sensor with a first example of embodiment of electrical contacts.
Figure 7B:
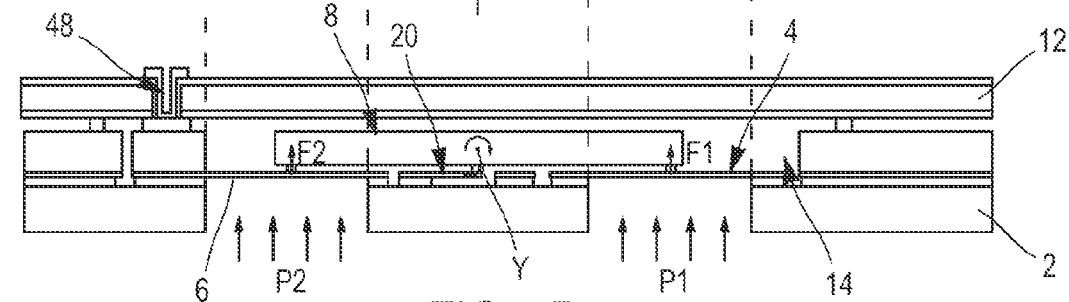

In FIGS. 7A and 7B may be seen a variant of embodiment of electrical connections. In this variant, the electrical connections are formed on the front face by vias 48 (or TSV (Through-Silicon Vias) through the cap on the front face of the opposite side with respect to the membranes and not on the rear face through the substrate as for the other examples represented. As for the TSV on the rear face, this variant makes it possible to recover the contacts directly inside the cavity or the cavities.

Figure 8A:
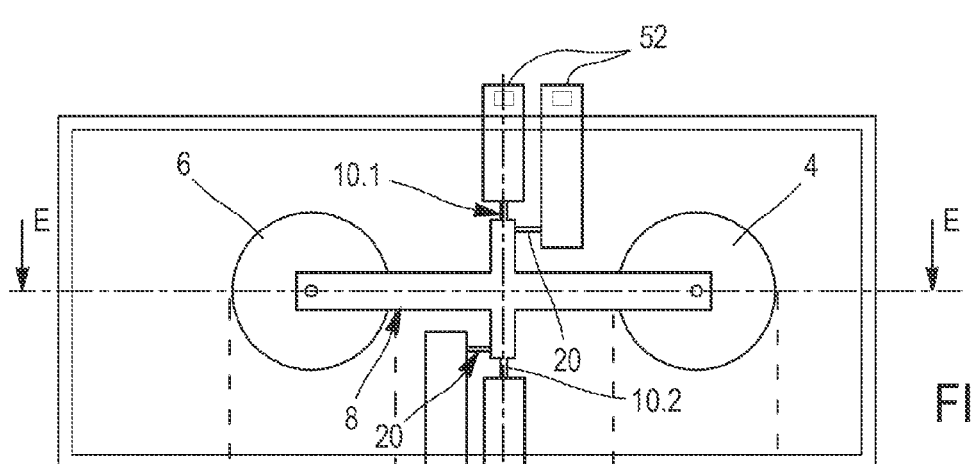
FIGS. 8A and 8B are top and sectional views along the line E-E respectively of another example of embodiment of a differential pressure measurement sensor with a second example of embodiment of electrical contacts.
Figure 8B:
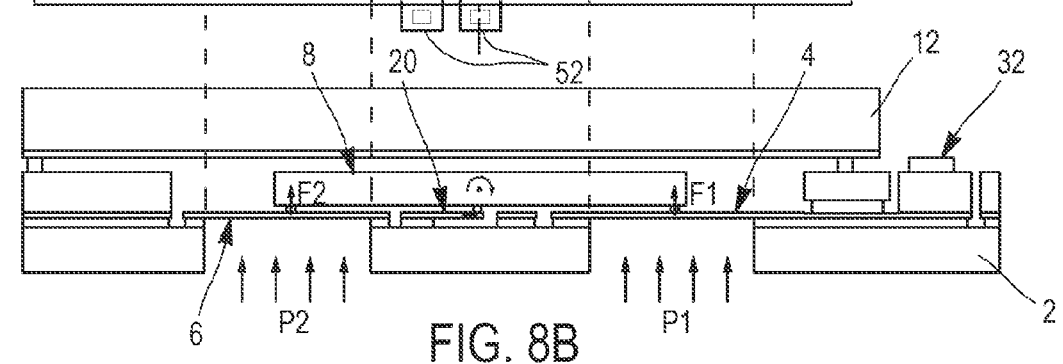

In FIGS. 8A and 8B may be seen another variant of embodiment of electrical connections in the front face. In this variant, the electrical contacts 52 are formed in such a way that they emerge outside of the cavity or the cavities. The anchoring pads forming electrical contact 52 are such that they pass under the sealing bead between the substrate 2 and the cap 12. Access to the electrical contacts is then obtained by sawing or etching of the cap in line with the electrical contacts outside of the cavity or cavities, and the electrical connections may be easily formed. These electrical contacts are designated "saw to reveal".

Figure 12:
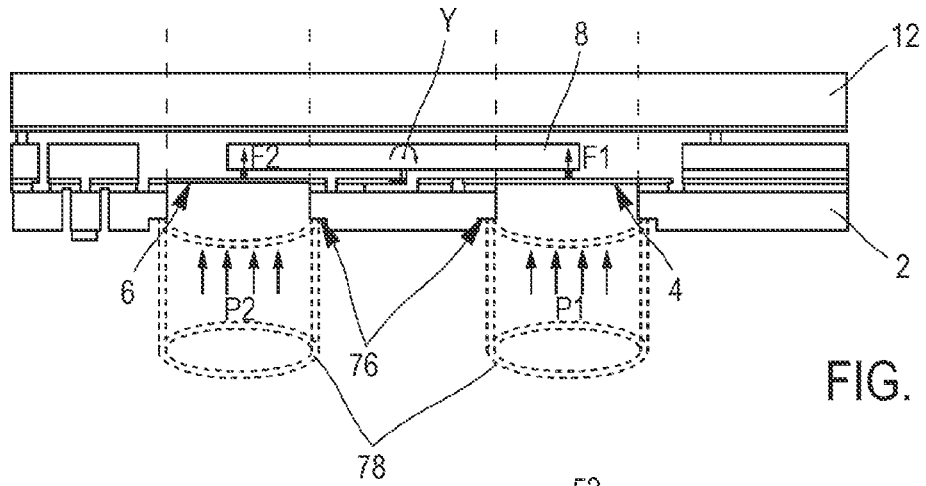
FIG. 12 is a longitudinal sectional view of another example of a sensor according to the invention with simplified case assembly.

Advantageously, the substrate supporting the membranes 4, 6 comprises on the rear face centring spans 76 lining the openings for accessing the faces 4.2, 6.2 of the membranes 4, 6 to facilitate the assembly of the connectors 78 to bring pressure onto the faces 4.2, 6.2 of the membranes 4, 6 respectively (FIG. 12).

Figure 13A:
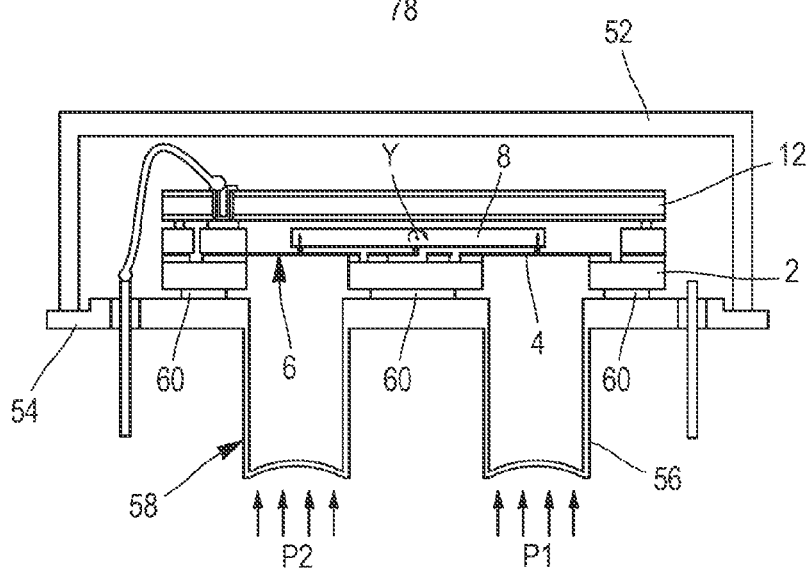
FIGS. 13A and 13B are longitudinal sectional views of example of assembly in the case of a differential pressure measurement sensor according to the invention.
Figure 13B:
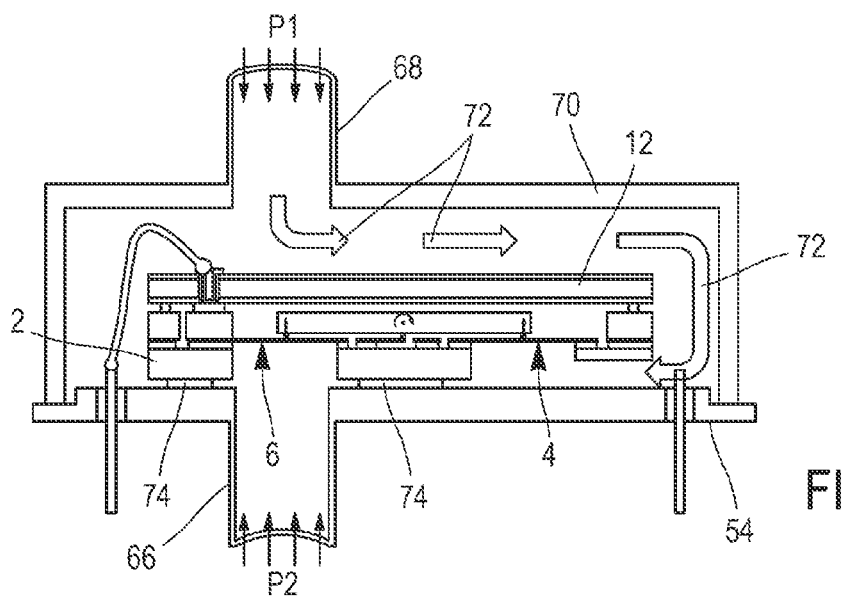

In FIGS. 13A and 13B may be seen examples of assembly of the sensor in a case forming a differential pressure measurement device.

The case comprises a bottom 54 and a cover 62.

In FIG. 13A, the assembly comprises a sensor according to one of the examples described, a bottom 54 on which is attached the differential pressure measurement sensor. The bottom 54 is provided with two pressure ports 56, 58 which, during the assembly of the sensor, are facing the openings for accessing the membranes 4, 6. The assembly of the sensor on the bottom 54 is sealed so as to isolate the pressure ports 56, 58, this sealing is obtained for example and advantageously directly by means of a bonding or brazing bead 60 between the bottom and the rear face of the substrate.

The cover 62 is sealed onto the bottom in order to protect the sensor. An electrical contact 64 is formed through the bottom and is connected for example by a connection wire to a TSV type contact formed on the front face. The mounting of the cover on the bottom may in this example not be sealed.

In FIG. 13B, the differential pressure measurement device comprises one pressure port 66 in the bottom 54 and another pressure port 68 in the cover 70. During the mounting of the sensor on the bottom, only one sealing is formed around the opening for accessing the membrane 6 by means of a bonding or brazing bead 74, the membrane 4 experiencing the pressure which is shown schematically by the arrows 72. In this embodiment, the assembly of the cover 2 on the bottom 54 is sealed since this is the case that assures the pressure P1 being brought onto the membrane 4. In a variant, a conduit could be added in the cover 12 and connect the pressure port 66 to the opening for accessing the membrane 4, thereby making a sealed mounting of the cover on the cap unnecessary.

For example, communication between the first membrane 4 and the pressure port 68 is realised by etching of the rear face of the substrate and/or by opening of the bead for attaching the sensor onto the bottom. In the case where the section of passage left by the opening of the sealing bead is not sufficient to have acceptable load losses, it may be provided to form an additional vent by etching the substrate to increase the total passage section.

It will be understood that the devices of FIGS. 13A and 13B may comprise a sensor with electrical contacts on the rear face or on the front face of the "saw to reveal" type.

The variants of embodiment have been described in considering a pressure measurement sensor with detection by piezoresistive strain gauge, but the variants of FIGS. 3, 4, 5A, 5B, 6, 7A, 7B, 8A, 8B, 9, 10, 11, 12, 13A, 13B apply to differential pressure measurement sensors with capacitive detection represented in FIGS. 2A and 2B and to resonant strain gauge pressure sensors represented in FIGS. 1C and 1D.

Moreover, the different variants may be combined together without going beyond the scope of the present invention.

It will be understood that in a preferred manner the differential pressure measurement sensor has a symmetrical structure in particular of the membranes, of the beam . . . , in order to simplify the treatment of the measurements supplied by the measurement means.

Thanks to the implementation of two membranes and a rigid linking element between the two membranes, it is possible to work back to a "true" differential pressure measurement, by cancelling the common static pressure. The measurement dynamic is then notably increased compared to a device using two absolute pressure sensors.

The sensor according to the invention combines both the advantages of absolute pressure sensors in which the measurement means are protected and the advantages of relative pressure sensors in terms of measurement dynamic. Furthermore, in the case where the reference pressure is a reference vacuum, thermal drifts are limited.

Thanks to the invention, the measurement means are isolated from the external environment, for example there is no longer a risk of drift of the capacitance or short-circuit in the case of capacitive measurement means. The measurement sensor is then more robust and more reliable.

Furthermore, thanks to the linking beam which can serve as amplifying arm, a considerable gain in sensitivity is obtained, which makes it possible to form a more efficient or smaller sensor.

Moreover, the membranes and the measurement means are decoupled, which enables a separate optimisation of these two parts of the sensor.

The sensors according to the invention make it possible to carry out a differential measurement, just as well in the case of the use of piezoresistive measurement means, as capacitive or resonant measurement means. This differential measurement makes it possible to increase the signal/noise ratio and to limit the thermal sensitivity of the sensor.

In the particular case of capacitive measurement means, when the electrostatic air gap is defined by a sacrificial layer between each of the membranes and the fixed electrode, it is possible to have good control of same.

Moreover, since the moving electrodes are borne by the linking beam and the fixed electrodes are borne by the substrate, it is possible to have a high volume of the cavity or cavities under vacuum, offering a large reference volume, thus a reference vacuum likely to be more stable and more intense than those in conventional sensors.

Moreover, it is easy to provide for mechanical stops assuring protection in the case of overpressure, pressure surge . . . .

As has already been mentioned, this structure is balanced and is insensitive to accelerations.

The sensor according to the invention further offers the advantage of being able to form the at least two membranes on the same layer and following the same steps. Membranes having similar or even identical mechanical properties are then obtained.

An example of method of manufacturing the pressure measurement sensor with detection by strain gauges of FIGS. 1A and 1B will now be described by means of FIGS. 14A to 14H, each figure represents the element in top view and sectional view.

The emplacements of different parts of the pressure measurement sensor, during formation in the different steps represented, are designated by the references of these parts.

It involves a manufacturing method using surface technology i.e. by deposition and successive machining of thin layers on a base substrate.

One starts with a SOI (Silicon on Insulator) substrate 100 comprising a substrate 101, an oxide layer 103 and an upper silicon layer 102 having a thickness comprised between several hundreds of nm and several μm. The oxide layer of the SOI substrate is designated 101.

Figure 14A:
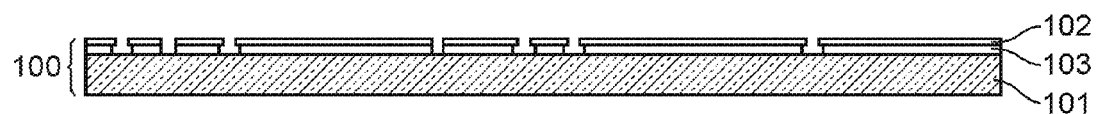
FIGS. 14A to 14H are top and longitudinal sectional views of different steps of forming a pressure measurement device according to an example of manufacturing method.
Figure 14B:
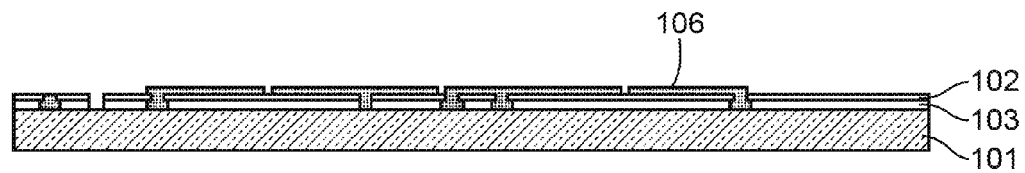
Figure 14C:
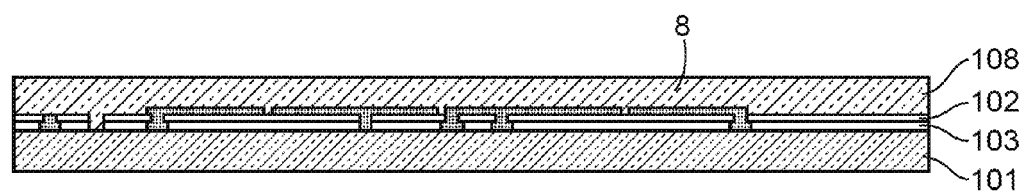
Figure 14D:
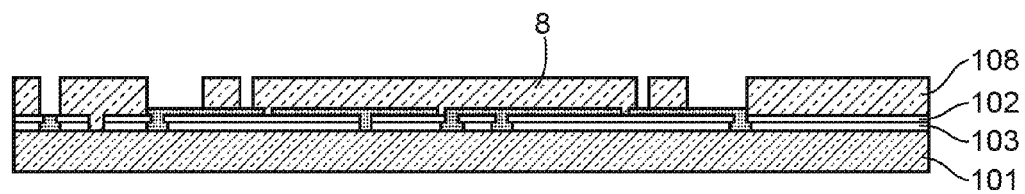
Figure 14E:
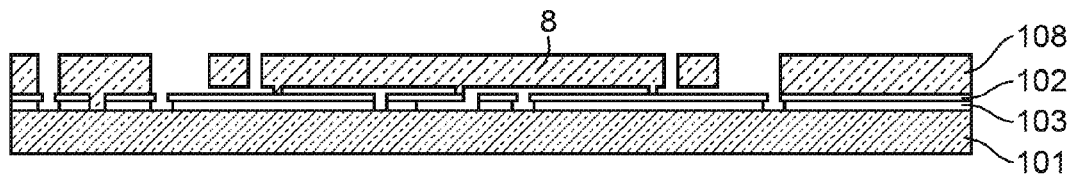
Figure 14F:
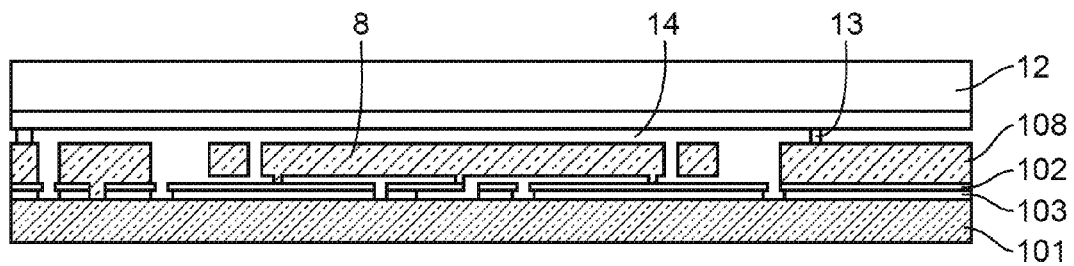
Figure 14G:
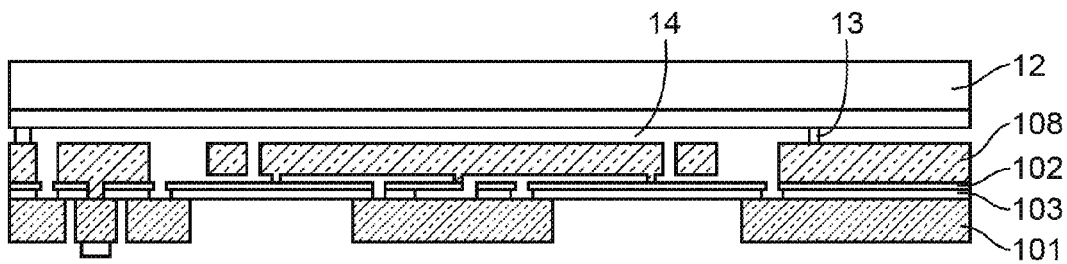
Figure 14H:
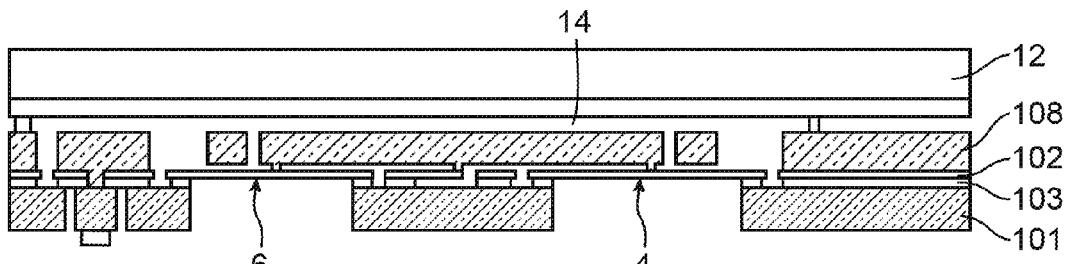

A lithography step is carried out in order to define the strain gauges, the torsion axis, the contour of the membranes 4, 6, the contour of the contact and embedding zones of the gauges and the torsion axis and the opening for renewal of contact on the rear face. In FIG. 14A, openings at the level of the contacts of the embedding pads are formed which make it possible to raise the electrical contacts between the substrate 101 and the active layer 102 during the epitaxy step, following the etching of the oxide in these openings.

An etching of the silicon layer is then carried out with stoppage on the oxide layer 103. The remaining resin is eliminated.

An etching of the oxide layer 103 is then carried out with stoppage on the substrate.

The element represented in FIG. 14A is obtained.

During a following step, a deposition is carried out of a SiO$_2$ layer 106, the thickness of which may be comprised between 1 μm and 3 μm. A lithography is then carried out to protect the strain gauges, the membranes 4, 6, and to define the opening of the contact zones and embedding pads of the gauges and of the torsion axis, and the opening of the anchoring zones 64 of the beam 8 on the membranes 4, 6. An etching of the layer 106 then takes place with stoppage on the silicon of the layer 102 and on the silicon 101 of the SOI substrate. The remaining resin is eliminated. The element thereby obtained is visible in FIG. 14B.

During a following step, the formation of a monocrystalline or polycrystalline silicon layer 108 takes place, for example by epitaxy, having typically a thickness comprised between 1 μm and several tens of μm. An abrasion and a chemical-mechanical planarization of the layer 108 may be carried out. The element obtained is visible in FIG. 14C.

During a following step, a lithography is carried out on the layer 108 in order to define the opening zone of the membranes 4, 6, and the opening zone of the gauges 20, and to define the linking beam 8 and the isolation zones of the contacts. An etching of the layer 108 is then carried out with stoppage on the SiO$_2$ layer 106. The remaining resin is eliminated. The element obtained is visible in FIG. 14D.

During a following step, the linking beam 8, the torsion axis and the gauges are freed by etching for example using hydrofluoric acid vapour. During this step, the layer 106 is entirely etched as well as part of the SiO$_2$ layer of the SOI substrate. During this step, the membranes 4, 6 are not yet freed. The element obtained is visible in FIG. 14E.

During a following step, sealing is carried out under vacuum of the cap 12 by means of a bead 13. In a variant, the sealing may be for example be of eutectic, SDB or anodic type in the case of a glass cap, i.e. without bead, the sealing being obtained by direct adhesion of the two surfaces 12 and 108. A cavity 14 is delimited between the cap 12 and the element of FIG. 14D.

The cap may have been prepared beforehand. The preparation of the cap may comprise the step of forming a cavity, deposition of getter, forming electrical routings or even an electronic (CMOS co-integration) in the case of eutectic sealing, . . . .

The sealed cavity around the membranes is then formed.

A thinning is then carried out of the substrate for example by abrasion on the rear face or "back-grinding" and chemical-mechanical planarization. The element obtained is visible in FIG. 14F.

During a following step, a deposition of a metal layer is carried out on the rear face of the substrate in order to form the contact on the rear face. Then, a lithography is carried out on this layer to delimit the contact on the rear face and finally an etching of the metal layer is carried out. The resin on the remaining metal layer is eliminated. A new lithography is carried out on the rear face to delimit the isolation zone of the contacts and the opening of the membranes 4, 6 as well as an etching of the substrate on the rear face, for example by DRIE ("deep reactive-ion etching") with stoppage on the oxide layer 103 of the SOI substrate. The remaining resin is eliminated. The element obtained is visible in FIG. 14G.

Finally, an etching is carried out on the rear face of the oxide layer 103 of the SOI substrate. The membranes are freed. The element obtained is visible in FIG. 14H.

In a variant, it may be envisaged to use instead of an SOI substrate a standard substrate, on which a deposition of a sacrificial layer, for example of oxide, has been carried out, as well as a deposition of a first layer of polysilicon or SiGe-Poly. The following steps are similar to those described in starting from an SOI substrate.

The thickness values are given uniquely by way of example. Generally speaking, the sacrificial layers (made of oxide) are comprised between several tens of nm and several microns, and the active layers, such as Si, SiGe, . . . are comprised between several tens of nm and several tens of μm.

The pressure measurement sensor according to the invention may be used in all fields where a differential pressure measurement is required, for example in the medical field, with a view to determining respiratory or gaseous exchanges. It may also be used in the field of climatic engineering, with the aim of controlling air flows. Thanks to an artificial constriction in the conduit of the flow, realised for example by means of a laminar element or a diaphragm, it is possible to obtain a pressure drop indicative of the flow rate. The differential pressure sensors measure the pressure upstream and downstream of the element. The sensor according to the invention may also be used in industrial or automobile or avionic environments: for the surveillance of filters for example by using the pressurisation principle to control the flow of air in climatic engineering. If the filter becomes blocked over time, it offers a greater resistance to the passage of the flow, and the pressure difference at the terminals of the filter increases. Differential pressure measurement sensors can measure this pressure difference and trigger alarms as soon as critical values are reached.

The invention claimed is:

1. MEMS and/or NEMS differential pressure measurement sensor comprising:
   at least one first membrane and at least one second membrane, each suspended from a substrate, the first membrane having a face subjected to a reference pressure and a second face subjected to a first pressure to be detected, the second membrane having a first face subjected to the reference pressure and a second face subjected to a second pressure to be detected,
   a rigid beam of longitudinal axis articulated with respect to the substrate by a pivot link around an axis said pivot link being located in a plane parallel to the first membrane and the second membrane which is different from the plane of the first membrane and the second membrane, said beam being in contact via a first zone to the first membrane and via a second zone to the second membrane such that the pivot link is situated between the first zone and the second zone of the beam,
   a cap delimiting with the substrate on the side of the first faces of a first and second membranes at least one hermetic cavity
   at least one movement sensor for measuring the movement of the rigid beam around the axis, said sensor being arranged at least in part on the substrate, said sensor being arranged in the at least one hermetic cavity.

2. Pressure measurement sensor according to claim 1, in which the axis of rotation is situated at the centre of the rigid beam and the first and second contact zones between the rigid beam and the first and second membranes respectively are at equal distances from the axis of rotation.

3. Pressure measurement sensor according to claim 1, in which the contact between the rigid beam and the first and second membranes takes place in the vicinity of the centre of the first and second membranes.

4. Pressure measurement sensor according to claim 1, in which the beam is secured to the first and second membranes by the first and second zones respectively.

5. Pressure measurement sensor according to claim 1, in which the rigid beam is secured to the first and/or the second membrane by a flexible link along the longitudinal axis of the rigid beam and rigid along a deformation axis of the first and/or the second membrane.

6. Differential pressure measurement sensor according to claim 1, in which the pivot link is formed by at least one beam parallel to the axis of rotation and subjected to torsional stress.

7. Differential pressure measurement sensor according to claim 1, in which the pivot link is formed by at least one beam parallel to the longitudinal axis and subjected to bending stress.

8. Differential pressure measurement sensor according to claim 1, comprising at least one stiffener for stiffening the first membrane and/or the second membrane.

9. Differential pressure measurement sensor according to claim 8, in which the at least one stiffener comprises at least one over-thickness zones on the first membrane and/or the second membrane.

10. Differential pressure measurement sensor according to claim 1, comprising at least one stop arranged facing the first membrane and/or the second membrane, opposite the face of the first membrane and/or the second membrane subjected to the pressure to be detected so as to limit the deformation of the first membrane and/or the second membrane.

11. Differential pressure measurement sensor according to claim 1, in which said stop is connected to an electrical connection.

12. Differential pressure measurement sensor according to claim 1, in which the at least one sensor comprises at least one suspended strain gauge connected by one end to the substrate by an anchoring pad and secured to the rigid beam in the vicinity of the axis of rotation such that a rotational movement of the rigid beam around the axis of rotation applies a strain to said strain gauge, said strain gauge having an axis arranged below or above the pivot axis.

13. Differential pressure measurement sensor according to claim 12, in which the at least one sensor comprises two strain gauges on either side of the longitudinal axis of the rigid beam.

14. Differential pressure measurement sensor according to claim 12, in which the strain gauge(s) is or are piezoresistive gauges.

15. Differential pressure measurement sensor according to claim 11, in which the strain gauge(s) is or are resonant gauges and in which the at least one sensor comprises means of exciting the resonant gauge(s) and a sensor of measuring the variation in vibration of the resonant gauge(s).

16. Differential pressure measurement sensor according to one of claims 1 to 10, in which the at least one sensor is a capacitive sensor.

17. MEMS and/or NEMS assembly comprising at least one differential pressure measurement sensor according to claim 1 and at least one inertial sensor formed on and in the same substrate.

18. Differential pressure measurement device comprising at least one differential pressure measurement sensor according to claim 1 and a case in which is mounted the differential pressure measurement sensor, said case comprising two separate pressure ports each connecting to said differential pressure measurement sensor such that one pressure port emerges on the second face of the first membrane and the other pressure port emerges on the second face of the second membrane.

19. Differential pressure measurement sensor according to claim 16, comprising at least one stop arranged facing the first membrane and/or the second membrane, opposite the face of the first membrane and/or the second membrane subjected to the pressure to be detected so as to limit the deformation of the first membrane and/or the second membrane and in which the capacitive sensor comprises two pairs of electrodes, a first pair comprising a fixed electrode and a facing moving electrode, the moving electrode being borne by the rigid beam, and a second pair comprising a fixed electrode and a facing moving electrode, the moving electrode being borne by the rigid beam in a zone opposite the zone bearing the moving electrode of the first pair with respect to the axis of rotation.

20. Differential pressure measurement sensor according to claim 16, in which the capacitive sensor comprises two pairs of electrodes, a first pair comprising a fixed electrode and a facing moving electrode, the moving electrode being borne by the first membrane and the fixed electrode being borne by a stop facing the first membrane, and a second pair comprising a fixed electrode and a facing moving electrode, the moving electrode being borne by the second membrane and the fixed electrode being borne by the stop facing the second membrane.

21. Differential pressure measurement sensor according to one of claims 1 to 17, in which one or more electrical contacts are formed in part in the hermetic cavity or the hermetic cavities and in part outside of the hermetic cavity or the hermetic cavities, and in which one or more electrical connections are connected to the electrical contact(s) outside the hermetic cavity or the hermetic cavities.

* * * * *

UNITED STATES PATENT AND TRADEMARK OFFICE
CERTIFICATE OF CORRECTION

PATENT NO.         : 9,528,895 B2
APPLICATION NO.    : 14/661430
DATED              : December 27, 2016
INVENTOR(S)        : Philippe Robert et al.

It is certified that error appears in the above-identified patent and that said Letters Patent is hereby corrected as shown below:

In the Claims

Column 18, Claim 15, Line 37 please replace "claim 11" with -- claim 12 --

Signed and Sealed this
Fourteenth Day of March, 2017

Michelle K. Lee
*Director of the United States Patent and Trademark Office*